(12) United States Patent
Takahashi (10) Patent No.: US 9,986,666 B2
(45) Date of Patent: May 29, 2018

(54) POWER CONVERTER WITH AIR CHANNEL (71) Applicant: FUJI ELECTRIC CO., LTD., Kawasaki-shi, Kanagawa (JP)

(72) Inventor: Kiyoshi Takahashi, Sagamihara (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days. days.

(21) Appl. No.: 15/364,444

(22) Filed: Nov. 30, 2016

(65) Prior Publication Data

US 2017/0223876 A1 Aug. 3, 2017

(30) Foreign Application Priority Data

Jan. 29, 2016 (JP) .................. 2016-016424

(51) Int. Cl.
*H05K 7/20* (2006.01)
*H01L 23/467* (2006.01)
*H02M 7/00* (2006.01)

(52) U.S. Cl.
CPC ....... *H05K 7/20945* (2013.01); *H01L 23/467* (2013.01); *H02M 7/003* (2013.01); *H05K 7/20909* (2013.01)

(58) Field of Classification Search
CPC .............. H01L 23/467; H05K 7/20909; H05K 7/1489; H05K 7/20918; H05K 1/0203; H05K 7/20409; H05K 7/20136; H05K 7/20209; H05K 7/20718; H05K 7/2089; H05K 7/20972; H05K 7/003; H05K 7/20945; H02M 3/00

See application file for complete search history.

(56) References Cited

U.S. PATENT DOCUMENTS

| 2009/0122218 | A1* | 5/2009 | Oh ..................... | G02F 1/133385 |
| | | | | 361/679.21 |
| 2011/0222243 | A1* | 9/2011 | Nagami ............... | B23K 9/1006 |
| | | | | 361/697 |
| 2014/0138068 | A1* | 5/2014 | Nienberg ........... | H05K 7/20909 |
| | | | | 165/121 |
| 2015/0062812 | A1* | 3/2015 | Hwang .............. | H05K 7/20009 |
| | | | | 361/692 |
| 2016/0037677 | A1* | 2/2016 | Yamanaka ......... | H05K 7/20918 |
| | | | | 361/697 |

FOREIGN PATENT DOCUMENTS

| JP | 2004-200283 A | 7/2004 |
| JP | 2004-274870 A | 9/2004 |
| JP | 2008-295142 A | 12/2008 |

* cited by examiner

*Primary Examiner* — Adam B Dravininkas
(74) *Attorney, Agent, or Firm* — Rabin & Berdo, P.C.

(57) ABSTRACT

A power converter, including a housing, an air channel that is installed in the housing and that has a top part and a leg part forming a T-shape, and a plurality of power conversion units that are arranged in the housing on opposite sides of the leg part of the air channel, each power conversion unit having at least one cooling fin formed thereon that projects into the top part of the air channel.

9 Claims, 12 Drawing Sheets

FIG. 4A PLAN VIEW
FIG. 4B FRONT VIEW
FIG. 4C RIGHT SIDE VIEW

FIG. 5A CROSS-SECTIONAL PLAN VIEW

FIG. 5B CROSS-SECTIONAL FRONT VIEW

FIG. 5C CROSS-SECTIONAL RIGHT SIDE VIEW

F I G. 1 2 A  CROSS-SECTIONAL WIDTH OF AIR CHANNEL ON ITS AIR INLET SIDE

F I G. 1 2 B  CROSS-SECTIONAL WIDTH OF AIR CHANNEL ON ITS AIR INLET SIDE

F I G. 1 2 C  CROSS-SECTIONAL WIDTH OF AIR CHANNEL ON ITS AIR INLET SIDE

POWER CONVERTER WITH AIR CHANNEL

CROSS REFERENCE TO RELATED APPLICATION

This application is based upon and claims the benefit of priority of the prior Japanese patent application No. JP 2016-016424, filed on Jan. 29, 2016, the entire contents of which are incorporated herein by reference.

FIELD

The present invention relates to a power converter that makes it possible to maintain a performance of a heat extractor of a power conversion unit maximally, wherein the power conversion units are provided on the right and left sides of a T-shaped air channel and are each configured to emit, from an air outlet, air intaken from two air inlets of the air channel, the air outlet being provided in the middle of the T-shaped air channel.

BACKGROUND

Figure 1:
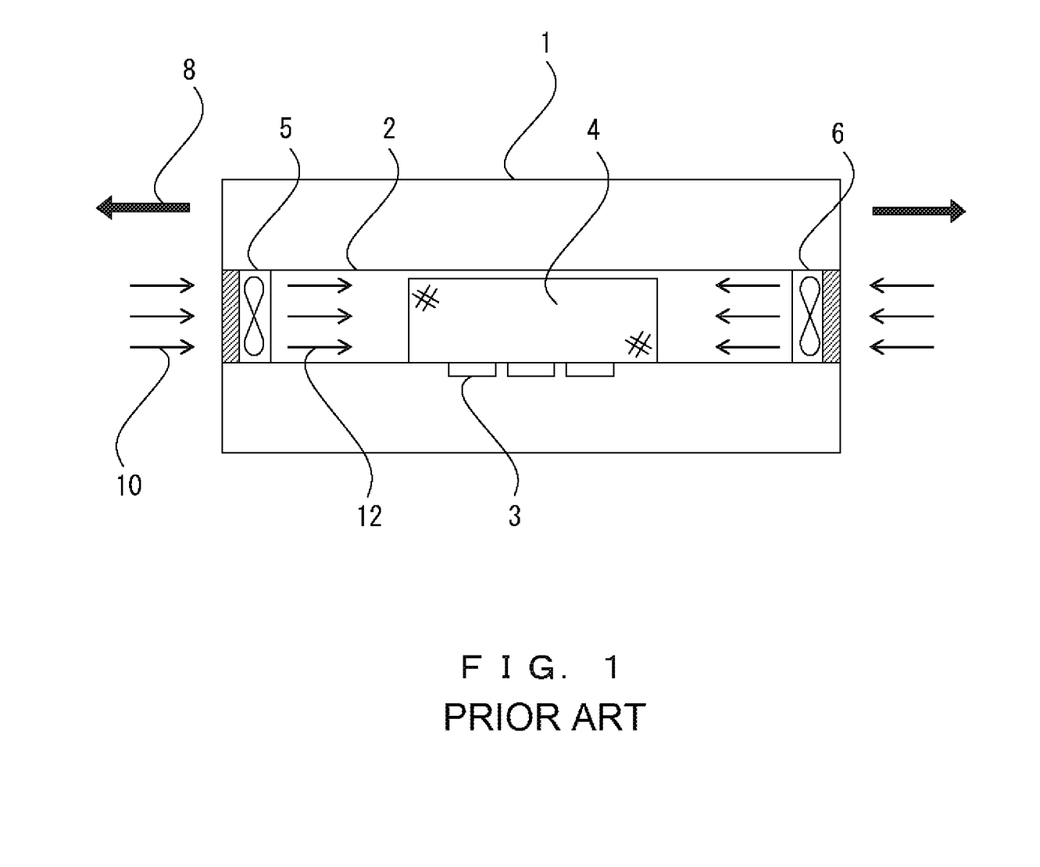
FIG. 1 illustrates a configuration of a semiconductor heat extractor disclosed in Patent Document 1.

FIG. 1 illustrates a configuration of a conventional semiconductor heat extractor disclosed in Patent Document 1 below. The conventional semiconductor heat extractor in FIG. 1 is constituted of an air channel 2 that is provided within a device housing 1, a cooling fin 4 that is provided with a semiconductor element 3, and electric blowers 5 and 6 situated on the right and left sides (in a front and rear in the traveling direction of a vehicle).

Heat generated due to a switching operation of the semiconductor element 3 is released through the cooling fin 4 that is mounted in parallel with the air channel 2.

For example, in this semiconductor heat extractor, a traveling wind 10 due to forward movement is generated by the vehicle traveling in a leftward direction 8. This traveling wind 10 flows as cooling air 12 into the air channel 2 of the device housing 1 when the electric blower 5 is driven, and is emitted through the cooling fin 4 in the air channel 2.

The heat generated due to a switching operation of the semiconductor element 3 is released to atmosphere by the cooling air 12 through the cooling fin 4 and an outlet of the air channel 2.

Patent Document 1: Japanese Laid-open Patent Publication No. 2008-295142 (FIG. 2)

DISCLOSURE OF INVENTION

There has been a problem in which, in the conventional technology disclosed in Patent Document 1 above, depending on a traveling direction, there may exist a cooling fan that is not driven, and the non-driven cooling fan acts in a direction in which ventilating pressure increases, which results in reducing an amount of cooling air.

Further, there has been a problem in which the conventional technology disclosed in Patent Document 1 needs to be controlled to only operate a cooling fan situated in the traveling direction of a vehicle in order to take in cooling air.

The present invention provides a power converter including a plurality of air inlets that make it possible to maintain a cooling performance of a heat extractor of a power conversion unit maximally.

An aspect of the present invention provides a power converter that includes an air channel that is installed in a housing and is T-shaped with a top part and a leg part, and a plurality of power conversion units that are arranged on opposite sides of the leg part of the T of the air channel with respect to each other, wherein cooling fins included in the plurality of power conversion units project into the top part of the T of the air channel.

Another aspect of the present invention provides the power converter, wherein the air channel includes air inlets, at ends of the top part of the T, that intake air, an air outlet, at an end of the leg part of the T, that externally emits the air intaken from the air inlets, and a cooling fan that is arranged in the leg part of the T.

Yet another aspect of the present invention provides the power converter, wherein a flow adjusting plate that adjusts air intaken from the air inlets is provided at the junction of the top part and the leg part of the T-shaped air channel.

In the power converter of the present invention, power conversion units are provided on the right and left sides of a leg part of the air channel that is T-shaped with a top part and the leg part, which makes it possible to maintain performance of heat extractors of the power conversion units maximally.

In other words, the T-shaped air channel that partitions a housing that accommodates the power converter is provided, and a cooling fin included in the heat extractor of each of the power conversion units provided on the right and left sides of the leg part of the T of the air channel is configured to project into the top part of the T of the air channel, which prevents heat generated from the heat extractor of one power conversion unit from affecting a cooling performance of the other power conversion unit negatively.

Further, in the power converter of the present invention, a flow adjusting plate is provided at the junction of the top part and the leg part of the T-shaped air channel, which prevents degradation of a cooling performance of the heat extractor of the power conversion unit due to a traveling wind disturbing cooling air when the power converter is provided in a vehicle, with the result that it becomes possible to maintain a cooling performance of the heat extractor of the power conversion unit maximally even when the vehicle is traveling.

Further, in the power converter of the present invention, the flow adjusting plate has a simple structure and can be easily mounted, which results in being able to maintain a cooling performance of the heat extractor of the power conversion unit maximally with fewer assembly steps at a lower cost, and the installation of the flow adjusting plate permits an increase in rigidity of a housing, which makes it possible to improve a performance against vibration and impact.

DESCRIPTION OF EMBODIMENTS

Embodiments of the present invention will now be described in detail with reference to the drawings.

First Embodiment

Figure 2:
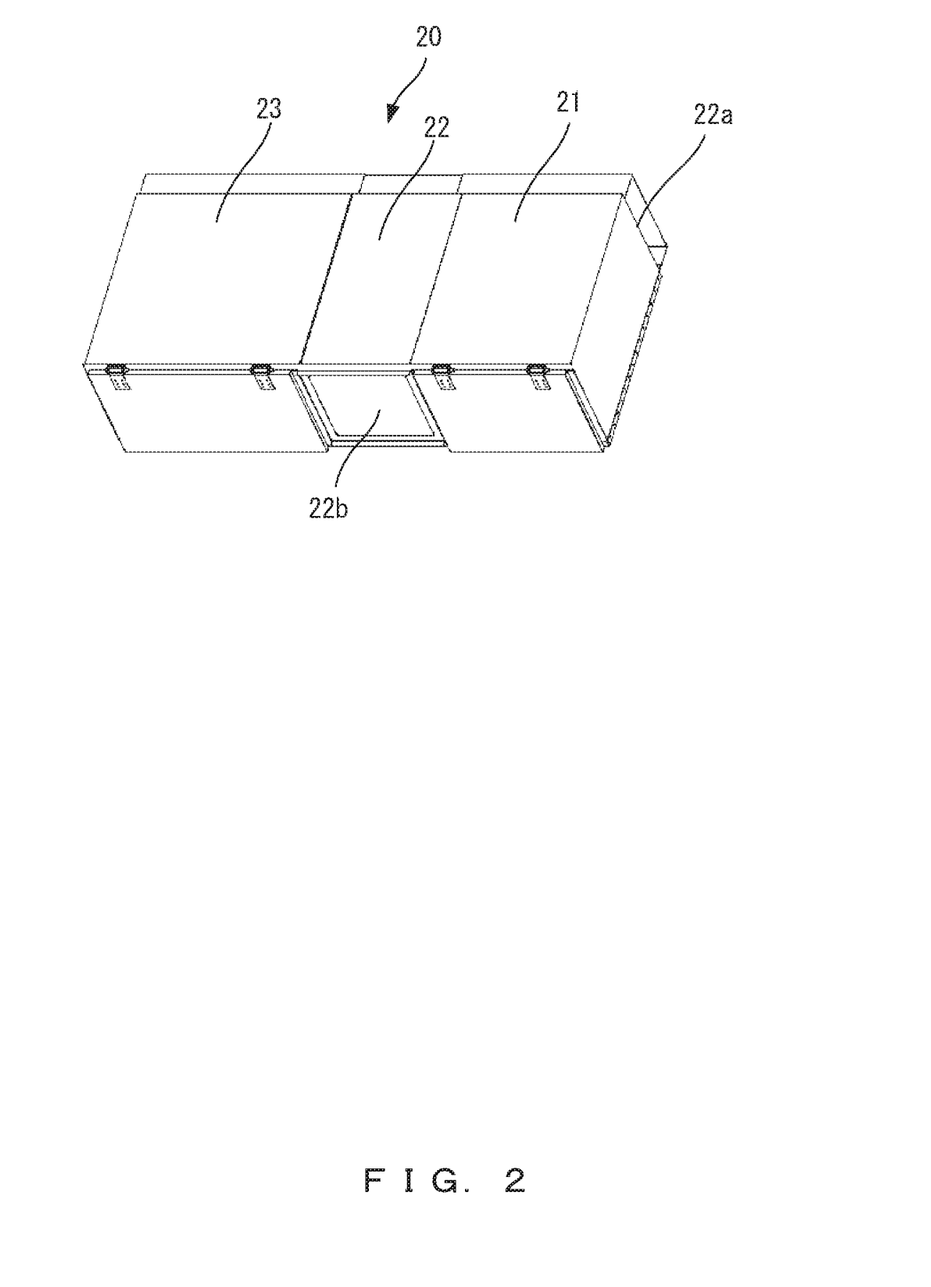
FIG. 2 is a perspective view of a configuration of a power converter according to a first embodiment of the present invention.

FIG. 2 is a perspective view of a configuration of a power converter 20 according to a first embodiment of the present invention. The power converter 20 has a configuration in which its housing is partitioned into three portions. One of the portions is an air channel 22 that is T-shaped with a top part and a leg part.

The housing of the power converter 20 is partitioned into two portions (i.e., right and left portions) by the leg part of the T of the air channel 22. Power conversion units 21 and 23 are respectively accommodated in the two portions obtained by the partition into the right and left sides of the leg part of the T of the air channel 22.

Although details are not illustrated, the power conversion units 21 and 23 each include a heat extractor constituted of a heat receiving plate and a cooling fin, wherein a semiconductor element is mounted on one surface of the heat receiving plate and the cooling fin is mounted on the other surface.

A cooling fin 25 of the power conversion unit (described later) is provided such that it projects into the top part of the T of the air channel 22 (on the side of an air inlet 22a, 22c (22c is not illustrated) of the air channel 22).

The power conversion units are partitioned inside the housing, and each of the power conversion units is configured to hermetically accommodate, in the partition, unit components other than a portion of the cooling fin 25 that projects into the top part of the air channel 22 described above, so its surface is covered with a cover.

The leg part of the T of the air channel 22 is configured to accommodate a mechanism (described later) that externally emits air that has passed through the cooling fin 25 of the power conversion unit described above.

With respect to the air channel 22, the air inlet 22a and an air outlet 22b are illustrated, but the air inlet 22c (described later) situated in a position opposite to that of the air inlet 22a is not illustrated.

The cooling fin 25 has a plate shape, and a plurality of cooling fins 25 are arranged in parallel along the air channel such that cooling air flows between the parallel-arranged cooling fins 25.

Figure 3:
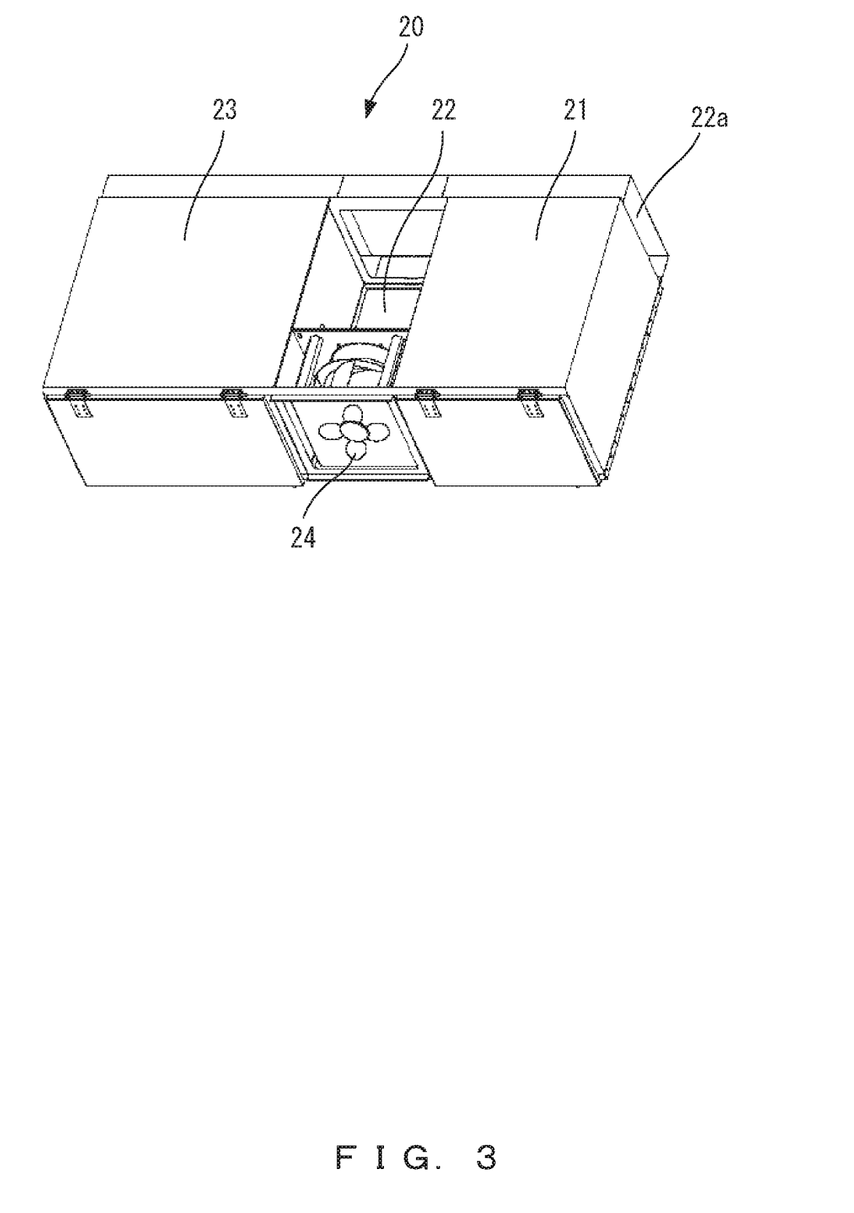
FIG. 3 is a perspective view that explains the configuration of the power converter according to the first embodiment.

FIG. 3 is a perspective view that explains the configuration of the power converter according to the first embodiment. In FIG. 3, the cover illustrated in FIG. 2 has been removed in order to explain a configuration of the air channel 22 of the power converter according to the first embodiment.

As illustrated in FIG. 3, the air channel 22 has a configuration in which cooling air intaken from the two air inlets 22a and 22c (22c is not illustrated) is sucked in by a cooling fan 24 and vented through the cooling fin 25 (not illustrated) that projects from the power conversion unit 21 into the air channel 22 and the cooling fins 25 (not illustrated) from the power conversion unit 23 into the air channel 22, respectively, so as to be emitted externally from the air outlet 22b that is arranged at the end of the leg part of the T of the air channel 22.

The cooling fan 24 used to emit air externally is arranged at the end of the leg part of the T of the air channel 22. The position of the cooling fan 24 is not limited to the end of the leg part of the T of the air channel 22, but it may be arranged in any position in the leg part of the T.

For example, an inverter is assumed to be the power conversion unit 21, and a converter (including a chopper) is assumed to be the power conversion unit 23.

Of course the power conversion units 21 and 23 are not limited to the examples described above, and the power conversion units 21 and 23 may be the same type of conversion unit.

Figures 4A, 4B, 4C:
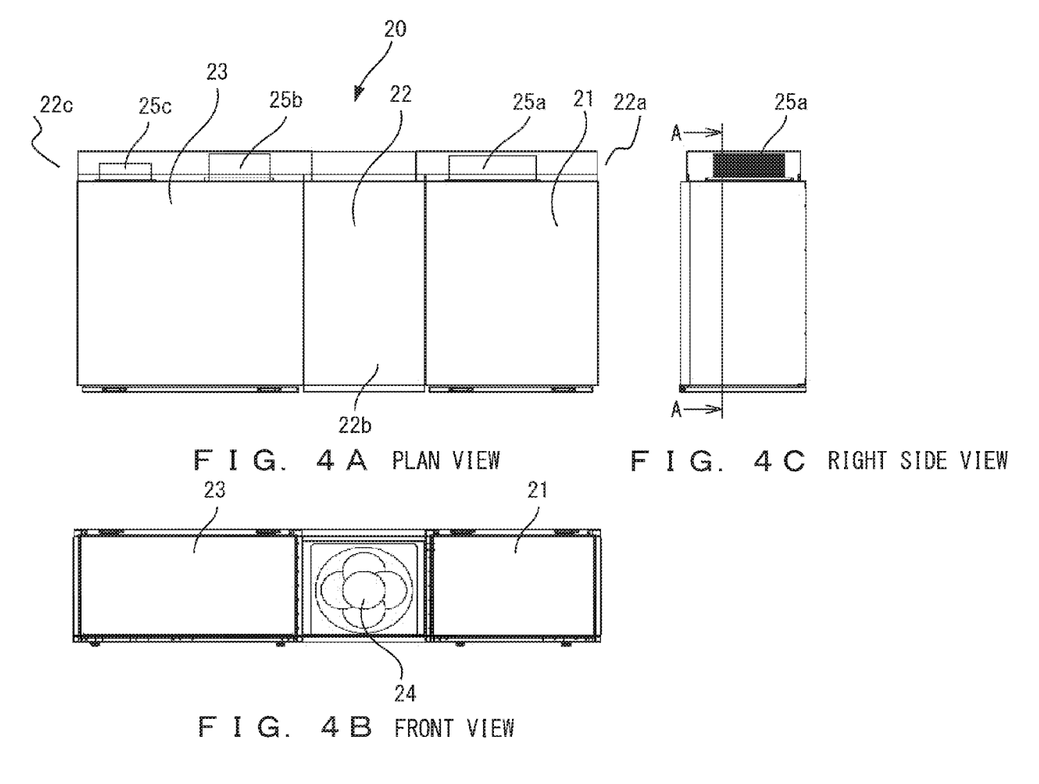
FIGS. 4A to 4C are three views that explain the configuration of the power converter according to the first embodiment.

FIGS. 4A to 4C are three views that explain the configuration of the power converter according to the first embodiment.

In FIGS. 4A to 4C, the power converter according to the first embodiment has a configuration in which cooling air intaken from the air inlets 22a and 22c arranged in the air channel 22 is sucked in by the cooling fan 24 and vented through the cooling fin 25a and the cooling fins 25b and 25c, respectively, so as to be emitted externally from the air outlet 22b situated at the end of the leg part of the T of the air channel 22, the cooling fins 25a to 25c projecting into the top part of the T of the air channel 22.

In the plan view of FIG. 4A, the cover illustrated in FIG. 2 has been removed such that the air inlets 22a and 22c, and the cooling fins 25a, 25b, and 25c which project into the air channel 22 are visible, but the cover is attached in the cases other than this case.

Accordingly, cooling air intaken from the two air inlets 22a and 22c arranged in the air channel 22 is sucked in by the cooling fan 24 and vented through the cooling fin 25a and the cooling fins 25b and 25c, respectively, so as to be emitted externally from the end of the leg part of the T of the air channel 22, wherein the cooling fin 25a projects from the power conversion unit 21 into the top part of the T of the air channel 22, and the cooling fins 25b and 25c project from the power conversion unit 23 into the top part of the T of the air channel 22. This makes it possible to maintain a cooling performance of the cooling fins 25a, 25b, and 25c maximally.

Further, if a configuration in which the cooling fin 25a of the power conversion unit 21 and the cooling fins 25b and 25c of the power conversion unit 23 are cooled by cooling air intaken from the different air inlets is adopted, it is possible to avoid heating interference between the power conversion units.

Figure 5A:
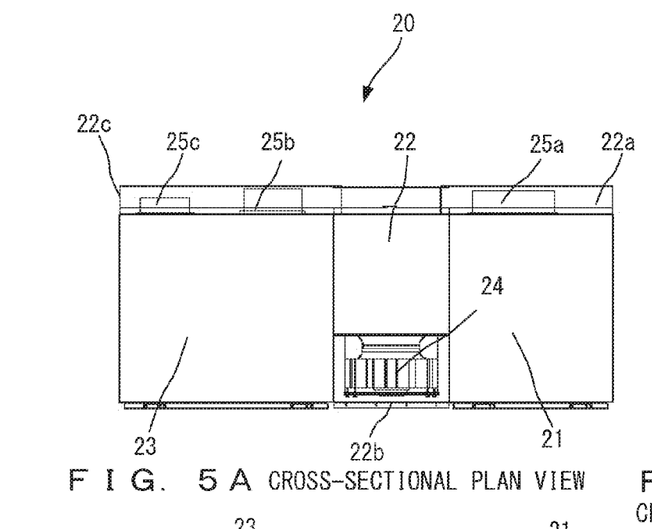
FIGS. 5A to 5C are cross-sectional views that explain the configuration of the power converter according to the first embodiment.
Figure 5B:
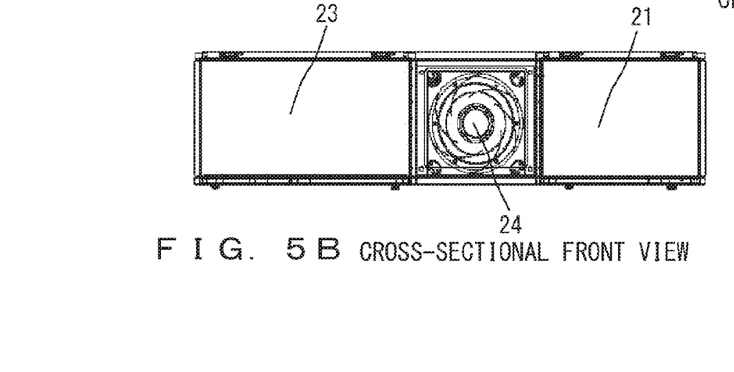
Figure 5C:
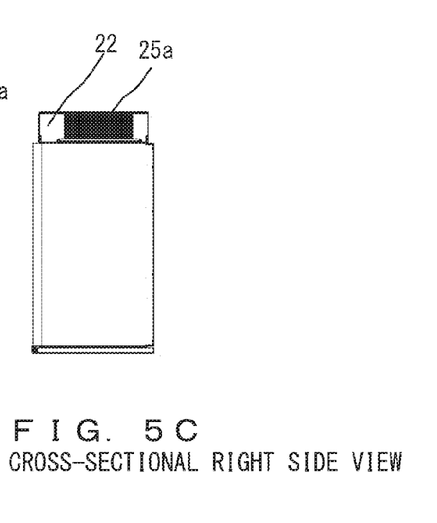

FIGS. 5A to 5C are cross-sectional views that explain the configuration of the power converter according to the first embodiment, as viewed along line A-A in the right side view of FIG. 4C.

In the power converter 20 according to the first embodiment illustrated in FIGS. 5A and 5B, the cover has been removed such that each section can be seen, except for the sections which accommodate the power conversion units 21 and 23.

As can be seen from the cross-sectional plan view of FIG. 5A, cooling air intaken from the air inlets 22a and 22c arranged in the air channel 22 is sucked in by the cooling fan 24 and vented through the cooling fin 25a and the cooling fins 25b and 25c, respectively, so as to be emitted externally from the cooling fan 24 placed at the air outlet 22b situated at the end of the leg part of the T arranged in the middle of the air channel 22, wherein the cooling fin 25a projects from the power conversion unit 21 and the cooling fins 25b and 25c project from the power conversion unit 23.

Figure 9:
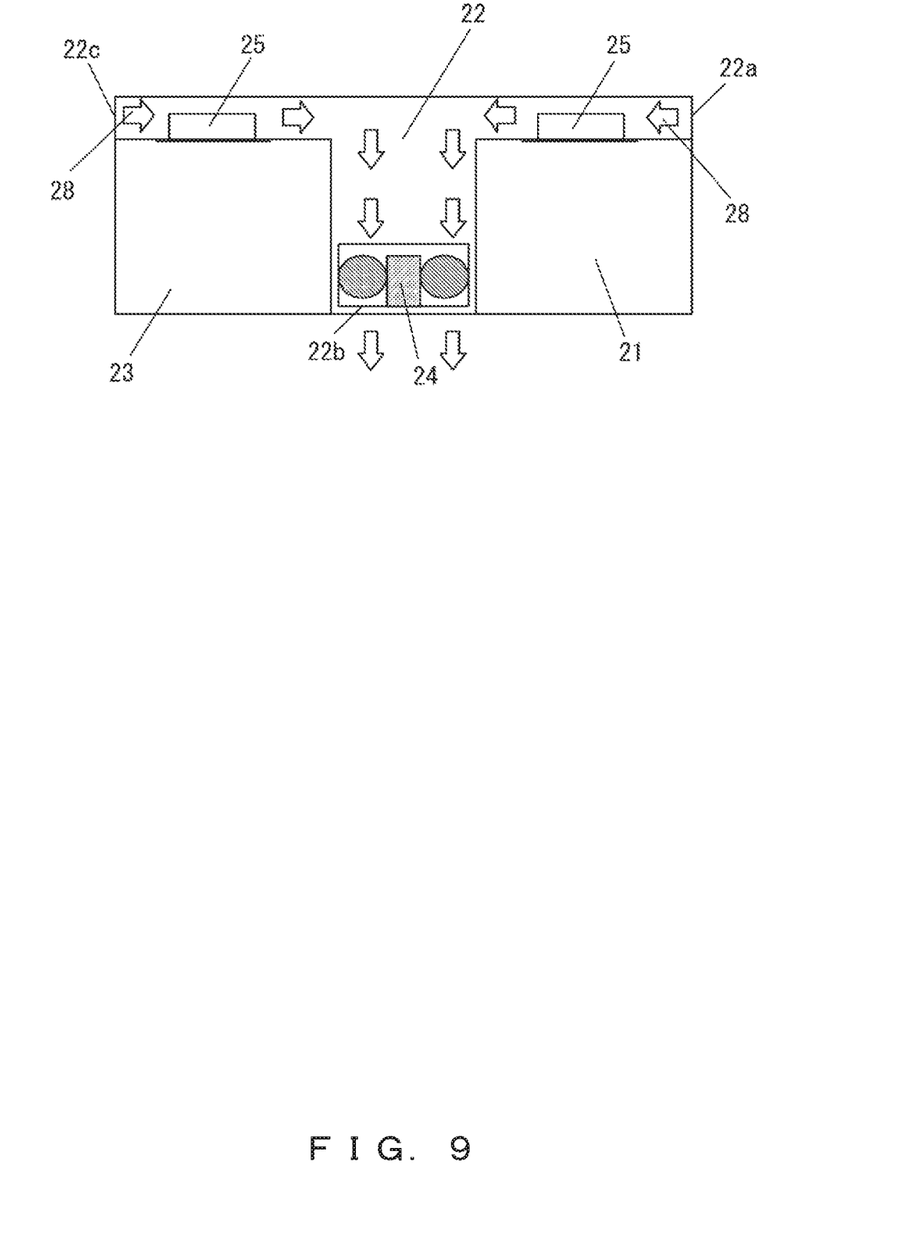
FIG. 9 is a cross-sectional plan view of the power converter according to the first embodiment, as viewed along line A-A of FIG. 4C, which illustrates a flow of cooling air.

FIG. 9 is a cross-sectional plan view of the power converter according to the first embodiment, as viewed along line A-A of FIG. 4C, which illustrates a flow of cooling air.

It is understood from FIG. 9 how rightward and leftward cooling air 28 intaken from the air inlets 22a and 22c arranged in the air channel 22 is sucked in by the cooling fan 24 and vented through the cooling fin 25 that projects from the power conversion unit 21 into the air channel 22 and the cooling fins 25 that project from the power conversion unit 23 into the air channel 22, respectively, so as to be emitted externally from the cooling fan 24 placed at the air outlet 22b of the leg part of the T arranged in the middle of the air channel 22.

FIG. 9 illustrates a flow of cooling air when the power converter according to the first embodiment is installed indoors, and this is also applicable to the outdoor case, although, in addition to cooling air, there exists a wind that flows into the power converter depending on the weather, and there may be a change in the flow due to the wind.

Second Embodiment

Figure 6:
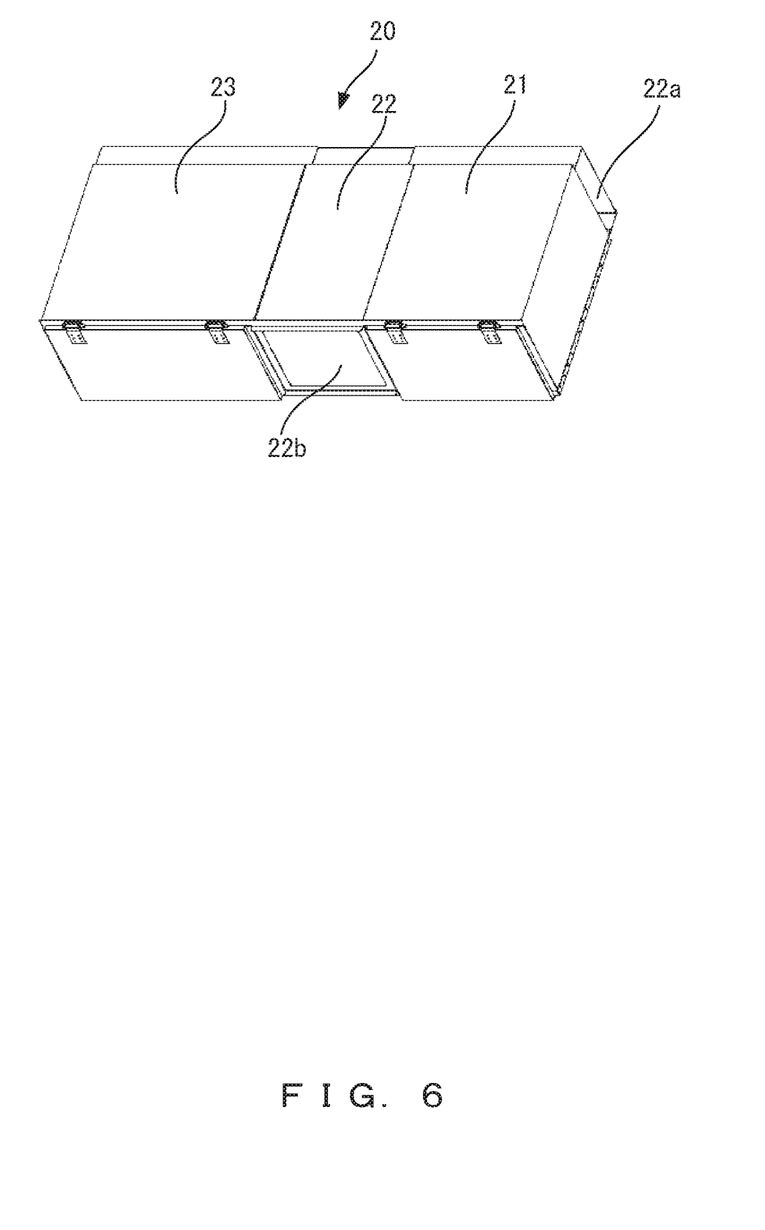
FIG. 6 is a perspective view of a configuration of the power converter according to a second embodiment of the present invention.

FIG. 6 is a perspective view of a configuration of the power converter according to a second embodiment of the present invention. The power converter 20 of FIG. 6 according to the second embodiment has a configuration in which its housing is partitioned into three portions, as in the above-described case in the first embodiment illustrated in FIG. 2.

In other words, one of the portions is the air channel 22 that is T-shaped with a top part and a leg part. The housing of the power converter 20 is partitioned into two right and left portions by the leg part of the T of the air channel 22.

The power conversion units 21 and 23 are respectively accommodated in the two portions obtained by the partition into the right and left sides of the leg part of the T of the air channel 22.

The configurations of the power conversion units 21 and 23 are as described in the first embodiment. The cooling fin 25 of the power conversion unit is provided such that it projects into the top part of the T of the air channel 22.

The power conversion units are partitioned inside the housing, and each of the power conversion units is configured to hermetically accommodate, in the partition, unit components other than a portion of the cooling fin 25 that projects into the air channel 22 described above, so its surface is covered with a cover.

The leg part of the T of the air channel 22 is configured to accommodate a mechanism (described later) that externally emits air that has passed through the cooling fin of the power conversion unit described above.

With respect to the air channel 22, the air inlet 22a and the air outlet 22b are illustrated, but the air inlet 22c (described later) situated in a position opposite to that of the air inlet 22a is not illustrated.

The cooling fin 25 has a plane shape, and a plurality of cooling fins 25 are arranged in parallel along the air channel such that cooling air flows between the parallel-arranged cooling fins 25.

Figure 7:
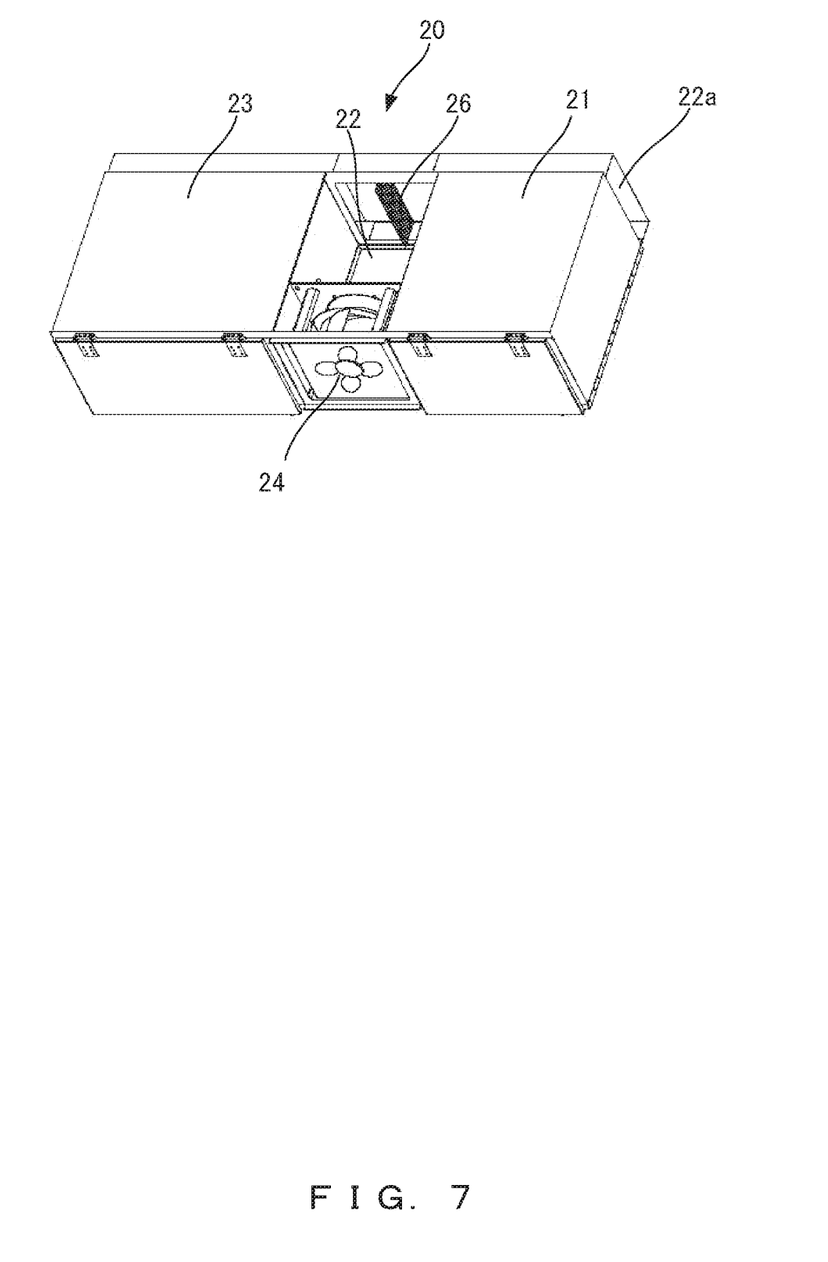
FIG. 7 is a perspective view that explains the configuration of the power converter according to the second embodiment.

FIG. 7 is a perspective view that explains the configuration of the power converter according to the second embodiment. In FIG. 7, the cover illustrated in FIG. 6 has been removed in order to explain a configuration of the air channel 22 of the power converter according to the second embodiment.

As illustrated in FIG. 7, the air channel 22 has a configuration in which cooling air intaken from the two air inlets 22a and 22c (22c is not illustrated) is sucked in by the cooling fan 24 and vented through the cooling fin 25 (not illustrated) that projects from the power conversion unit 21 into the air channel 22 and the cooling fins 25 (not illustrated) from the power conversion unit 23 into the air channel 22, respectively, so as to be emitted externally from the air outlet 22b that is arranged at the end of the leg part of the T of the air channel 22.

The cooling fan 24 used to emit air externally is arranged at the end of the leg part of the T of the air channel 22. The position of the cooling fan 24 is not limited to the end of the leg part of the T of the air channel 22, but it may be arranged in any position in the leg part of the T.

For example, an inverter is assumed to be the power conversion unit 21, and a converter (including a chopper) is assumed to be the power conversion unit 23. Of course the power conversion units 21 and 23 are not limited to the examples described above, and the power conversion units 21 and 23 may be the same type of conversion unit.

Further, in order to adjust a flow of intaken air, a flow adjusting plate 26 is arranged at the junction of the top part and the leg part of the T-shaped air channel 22 described above.

The arrangement position of the flow adjusting plate 26 is not limited to this example, and the flow adjusting plate 26 may be arranged closer to the side of the cooling fin 25b of the power conversion unit 23, or may be arranged closer to the side of the cooling fin 25a of the power conversion unit 21.

In other words, the arrangement position will be considered when a cooling performance is not exhibited sufficiently because there is a great difference between the amount of heat released by the power conversion unit 21 and that released by the power conversion unit 23. The structure of the flow adjusting plate 26 is also not limited to this example. Another example of the structure will be described later.

The flow adjusting plate 26 is arranged such that it has a portion that projects from the top part into the leg part of the T of the air channel 22.

If these configurations and arrangements are made, a traveling wind (described later) will not disturb cooling air intaken from the air inlets 22a and 22c (22c is not illustrated) when the power converter 20 according to the second embodiment is provided in a vehicle (not illustrated), the traveling wind flowing into the air inlet 22a or 22c (22c is not illustrated) that is situated in a traveling direction of the vehicle.

This makes it possible to maintain a cooling performance of the cooling fin 25a of the power conversion unit 21 and of the cooling fins 25b and 25c of the power conversion unit 23 maximally.

When the power converter according to the second embodiment is mounted on a vehicle (not illustrated), it is mounted the top part of the T of the air channel 22 in parallel with the traveling direction of the vehicle. However, the configuration is not limited to this, and the top part of the T of the air channel 22 may be mounted perpendicularly to the traveling direction of the vehicle.

When the vehicle (not illustrated) is a railroad vehicle, the power converter is preferably mounted under the floor of the vehicle.

The top part of the T-shaped air channel 22 may be sloped from the air inlet 22a or 22c (22c is not illustrated) of the air channel 22 to the connection with the leg part. Alternatively, the leg part of the T-shaped air channel 22 may be sloped downward or may be downward in a vertical direction from the connection with the top part to the air outlet 22b.

This configuration prevents, for example, rainwater from being gathered in the top part or the leg part of the air channel 22. Further, the air outlet 22b of the air channel 22 may be mounted in a direction opposite to the traveling direction of a vehicle.

Figure 8A:
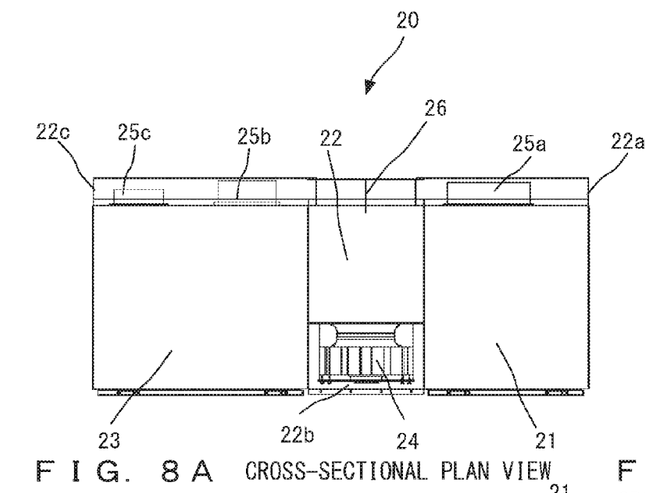
FIGS. 8A to 8C are cross-sectional views that explain the configuration of the power converter according to the second embodiment.
Figure 8B:
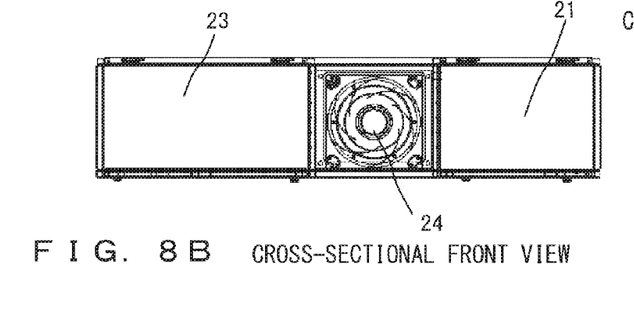
Figure 8C:
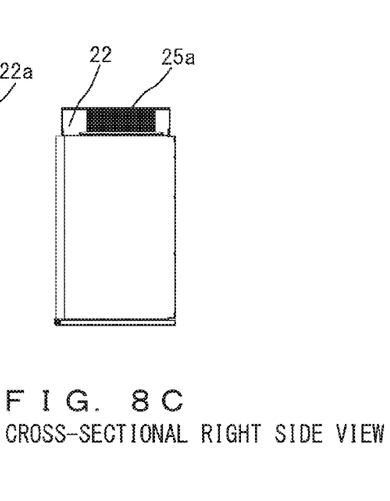

FIGS. 8A to 8C are three views that illustrate the configuration of the power converter of FIG. 6 according to the second embodiment.

In the power converter 20 according to the second embodiment illustrated in FIGS. 8A and 8B, the cover illustrated in FIG. 6 has been removed such that the air inlets 22a and 22c, and the cooling fin 25a and the cooling fins 25b and 25c which respectively project from the power conversion unit 21 and the power conversion unit 23 are visible, but the cover is attached in the cases other than this case.

As can be seen from the cross-sectional plan view of FIG. 8A, the flow adjusting plate 26 having a portion that projects into the side of the cooling fan 24 is arranged, the flow adjusting plate 26 being longer than the cross-sectional width of the air inlet 22a, 22c of the air channel 22.

The cooling fin 25a of the power conversion unit 21 projects into the air channel 22. The power conversion unit 23 is provided with the cooling fins 25b and 25c.

The flow adjusting plate 26 is arranged such that it has a portion that projects from the top part into the leg part of the T of the air channel 22

Figure 10:
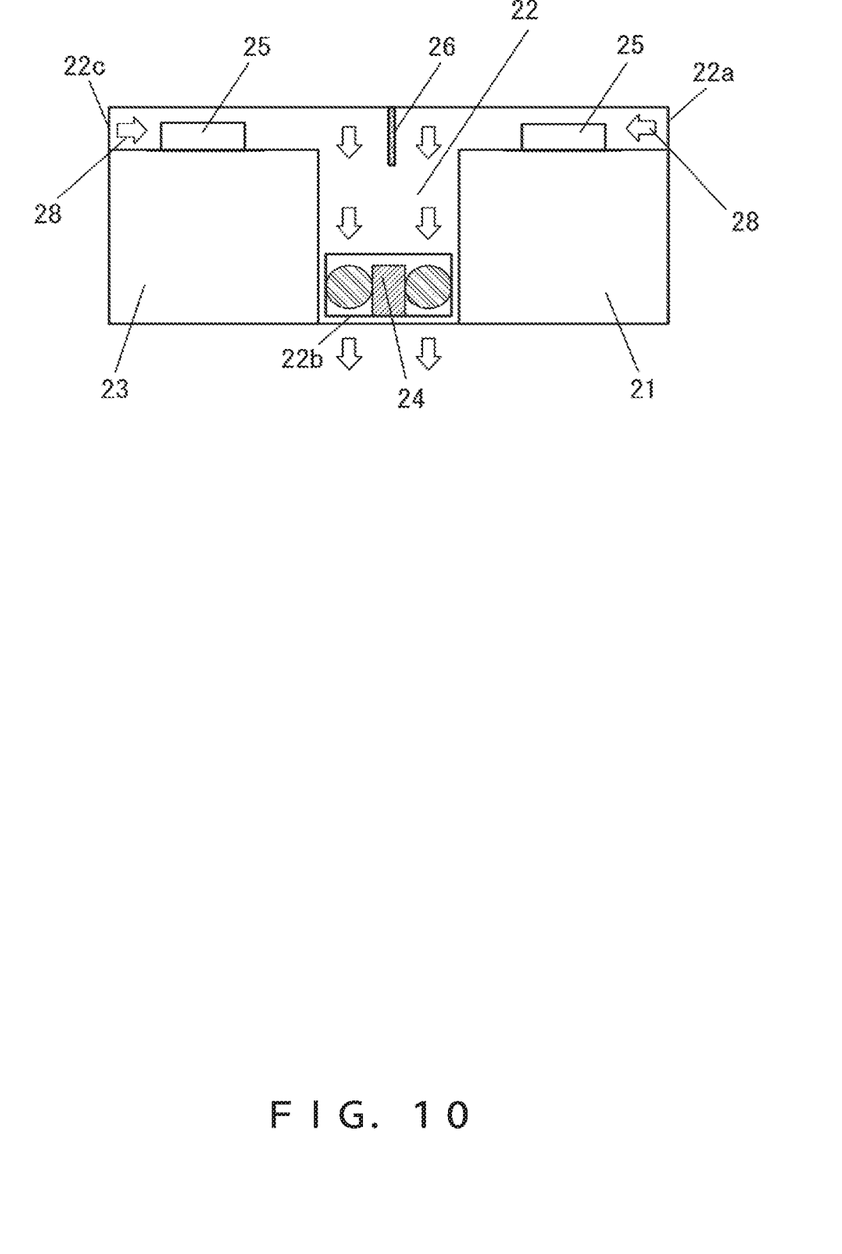
FIG. 10 is a cross-sectional plan view of the power converter according to the second embodiment, as viewed along line A-A of FIG. 4C, as is the case in FIG. 9, and illustrates a flow of cooling air due to a flow adjusting plate.

FIG. 10 is a cross-sectional plan view of the power converter according to the second embodiment, as viewed along line A-A of FIG. 4C, as is the case in FIG. 9, and illustrates a flow of cooling air due to the flow adjusting plate.

The cooling air 28 intaken from the air inlets 22a and 22c flows into the leg part of the T of the air channel 22 from the flow adjusting plate 26 without separate streams disturbing each other, and is sucked in by the cooling fan 24, so as to be emitted from the air outlet 22b.

The cooling fins 25 of the power conversion units 21 and 23 are cooled in this process, which results in maintaining a cooling performance of the cooling fins of the power conversion units 21 and 23 maximally.

As described above, the change in the arrangement position of the flow adjusting plate 26 will be considered when a cooling performance is not exhibited sufficiently because there is a great difference between the amount of heat released by the power conversion unit 21 and that released by the power conversion unit 23. For example, if the amount of heat released by the power conversion unit 21 is larger than that released by the power conversion unit 23, the flow adjusting plate 26 is arranged closer to the side of the power conversion unit 23. This permits an increase in cooling air intaken into the air channel 22 from the air inlet 22a.

Figure 11:
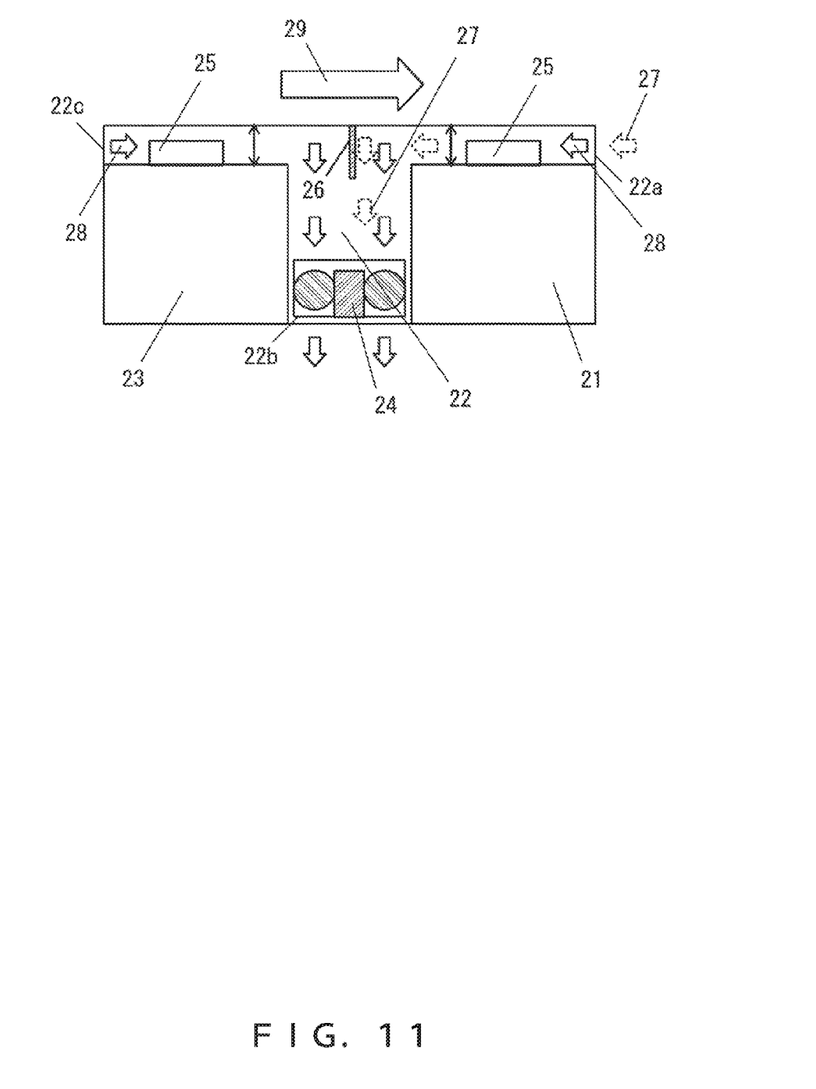
FIG. 11 is a cross-sectional plan view of the power converter according to the second embodiment which illustrates flows of cooling air and a traveling wind due to the flow adjusting plate.

FIG. 11 is a cross-sectional plan view of the power converter according to the second embodiment which illustrates flows of cooling air and a traveling wind due to the flow adjusting plate.

In FIG. 11, it is assumed that a vehicle is provided with the housing of the power converter of FIG. 6 while traveling.

Here, when the vehicle travels in a traveling direction 29 (see the direction of an arrow situated above the power converter in FIG. 11), a traveling wind 27 flows into the air inlet 22a of the air channel 22 along with the cooling air 28.

The traveling wind 27 is vented through the cooling fin 25 of the power conversion unit 21 along with the cooling air 28, flows into the leg part of the T of the air channel 22 from the flow adjusting plate 26, and is sucked in by the cooling fan 24, so as to be emitted from the air outlet 22b.

The cooling air 28 intaken from the other air inlet 22c flows into the leg part of the T of the air channel 22 from the flow adjusting plate 26 without being disturbed by the traveling wind 27 which is blowing from the traveling direction, and is sucked in by the cooling fan 24, so as to be emitted from the air outlet 22b.

As described above, the power converter according to the second embodiment is provided with the flow adjusting plate 26, which makes it possible to maintain a cooling performance of the cooling fin 25 of the power conversion unit 21 and the cooling fins 25 of the power conversion unit 23 maximally without a traveling wind disturbing cooling air that flows from a direction opposite to the traveling direction of a vehicle.

Figure 12A:
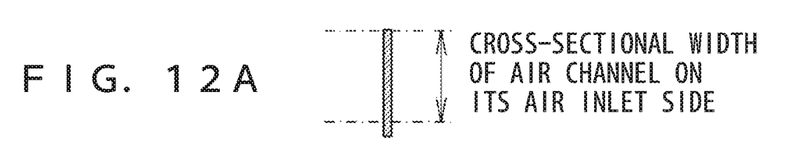
FIGS. 12A to 12C illustrate configurations of the flow adjusting plate of the power converter according to the second embodiment.
Figure 12B:
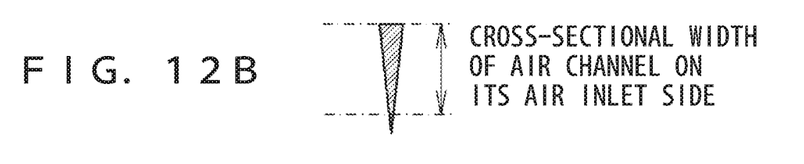
Figure 12C:
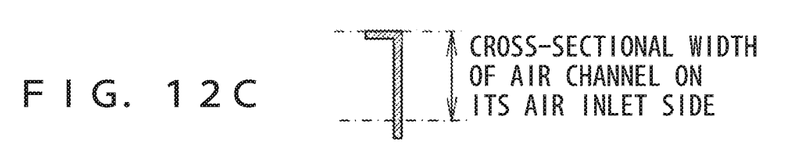

FIGS. 12A to 12C illustrate configurations of the flow adjusting plate 26 of the power converter according to the second embodiment, as viewed from above.

As described above, the flow adjusting plate 26 is essentially arranged at the junction of the top part and the leg part of the T of the air channel 22.

The flow adjusting plate 26 of FIG. 12A is configured to have a side cross section having a flat plate shape, and is arranged such that it has a portion that projects from the top part into the leg part of the T of the air channel 22, as described above.

The flow adjusting plate 26 of FIG. 12B is configured to have a side cross section having a triangular shape instead of a flat-plate shape, and is arranged such that it has a portion that projects from the top part into the leg part of the T of the air channel 22, as is the case in FIG. 12A. Preferably, the triangular shape has a sharpened vertex as illustrated by the figure.

The flow adjusting plate 26 of FIG. 12C is configured to have a side cross section having an inverted-L-shape instead of a flat-plate shape, and is arranged such that it has a portion that projects from the top part into the leg part of the T of the air channel 22, as is the case in FIG. 12A.

Preferably, the flow adjusting plate 26 is fixed on an air channel member by, for example, welding, brazing, or swaging (riveting).

INDUSTRIAL APPLICABILITY

The power converter according to the present invention can be installed in place, regardless of whether it is indoors or outdoors. For example, it can be installed in a railroad vehicle, a land vehicle (such as a trailer and a refrigerator truck), a PCS (power conditioning system) provided in photovoltaic equipment, or the like.

What is claimed is:

1. A power converter, comprising:
   a housing;
   an air channel that is installed in the housing, and that has
      a top part and a leg part that form a T-shape, the air channel including
      two air inlets formed at two ends of the top part thereof for taking in air, and
      an air outlet formed at an end of the leg part thereof for emitting the air taken in from the air inlets;
   a plurality of power conversion units that are arranged in the housing on opposite sides of the leg part of the air channel, each power conversion unit having at least one cooling fin formed thereon that projects into the top part of the air channel; and
   a cooling fan disposed in the leg part of the air channel.

2. The power converter according to claim 1, wherein the air channel further includes a flow adjusting plate formed at a junction of the top part and the leg part for adjusting the air taken in from the air inlets.

3. The power converter according to claim 2, wherein the flow adjusting plate projects from the top part into the leg part of the air channel.

4. The power converter according to claim 3, wherein the flow adjusting plate, in a side cross-sectional view thereof, is of a flat plate shape.

5. The power converter according to claim 3, wherein the flow adjusting plate, in a side cross-sectional view thereof, is of a triangular shape.

6. The power converter according to claim 3, wherein the flow adjusting plate, in a side cross-sectional view thereof, is of an inverted-L-shape.

7. The power converter according to claim 1, wherein
   a space inside the housing is partitioned into two portions by the T-shaped air channel, and
   each of the power conversion units, except for the at least one cooling fin thereof that projects into the top part of the air channel, is hermetically disposed in one of the two portions.

8. The power converter according to claim 7, wherein
   each of the cooling fins is of a plate shape, and
   all of cooling fins are arranged in a straight line along the top part of the air channel.

9. The power converter according to claim 1, wherein each power conversion unit is a converter or an inverter.

* * * * *